(12) United States Patent
Endo et al.

(10) Patent No.: US 7,785,449 B2
(45) Date of Patent: Aug. 31, 2010

(54) MAGNETRON UNIT, MAGNETRON SPUTTERING APPARATUS, AND METHOD OF MANUFACTURING ELECTRONIC DEVICE

(75) Inventors: Tetsuya Endo, Komae (JP); Noel Einstein Abarra, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 12/477,510

(22) Filed: Jun. 3, 2009

(65) Prior Publication Data
US 2009/0236219 A1 Sep. 24, 2009

Related U.S. Application Data

(63) Continuation of application No. PCT/JP2008/069799, filed on Oct. 30, 2008.

(30) Foreign Application Priority Data
Oct. 31, 2007 (JP) ............................. 2007-283438

(51) Int. Cl.
*C23C 14/35* (2006.01)
(52) U.S. Cl. ..................... 204/192.12; 204/192.15; 204/192.17; 204/192.2; 204/192.26; 204/192.29; 204/298.2; 335/296; 335/306
(58) Field of Classification Search ............ 204/192.12, 204/192.15, 192.17, 192.2, 192.26, 192.29, 204/298.2, 298.19, 298.22; 335/296, 306; 156/345.42, 345.46, 345.49; 118/723 MR, 118/723 MA, 723 E, 723 ER
See application file for complete search history.

(56) References Cited

FOREIGN PATENT DOCUMENTS

| JP | 59-137965 | 3/1983 |
|---|---|---|
| JP | 03-075368 | 3/1991 |
| JP | 03-075369 | 3/1991 |
| JP | 05-148639 | 6/1993 |
| JP | 07-026202 | 3/1995 |
| JP | 09-118980 | 5/1997 |
| JP | 10-025572 | 1/1998 |
| JP | 2000-212739 | 8/2000 |
| JP | 2007-131895 | 5/2007 |

*Primary Examiner*—Rodney G McDonald
(74) *Attorney, Agent, or Firm*—Fitzpatrick, Cella, Harper & Scinto

(57) ABSTRACT

A magnetron unit includes a plurality of first magnet elements each including first magnets which have the same polarity and are provided on two end portions of a yoke plate made of a magnetic material and a second magnet which has a polarity different from that of the first magnets and is provided on a middle portion of the yoke plate, a base plate on which a moving unit is placed to make each of the plurality of first magnet elements move in one direction, and a second magnet element which includes yoke plates made of a magnetic material and fixed to two end portions respectively, of the base plate, a magnet which has the same polarity as that of the second magnet and is placed on the yoke plate and a magnet which has the same polarity as that of the first magnet and is placed on the magnet.

20 Claims, 14 Drawing Sheets

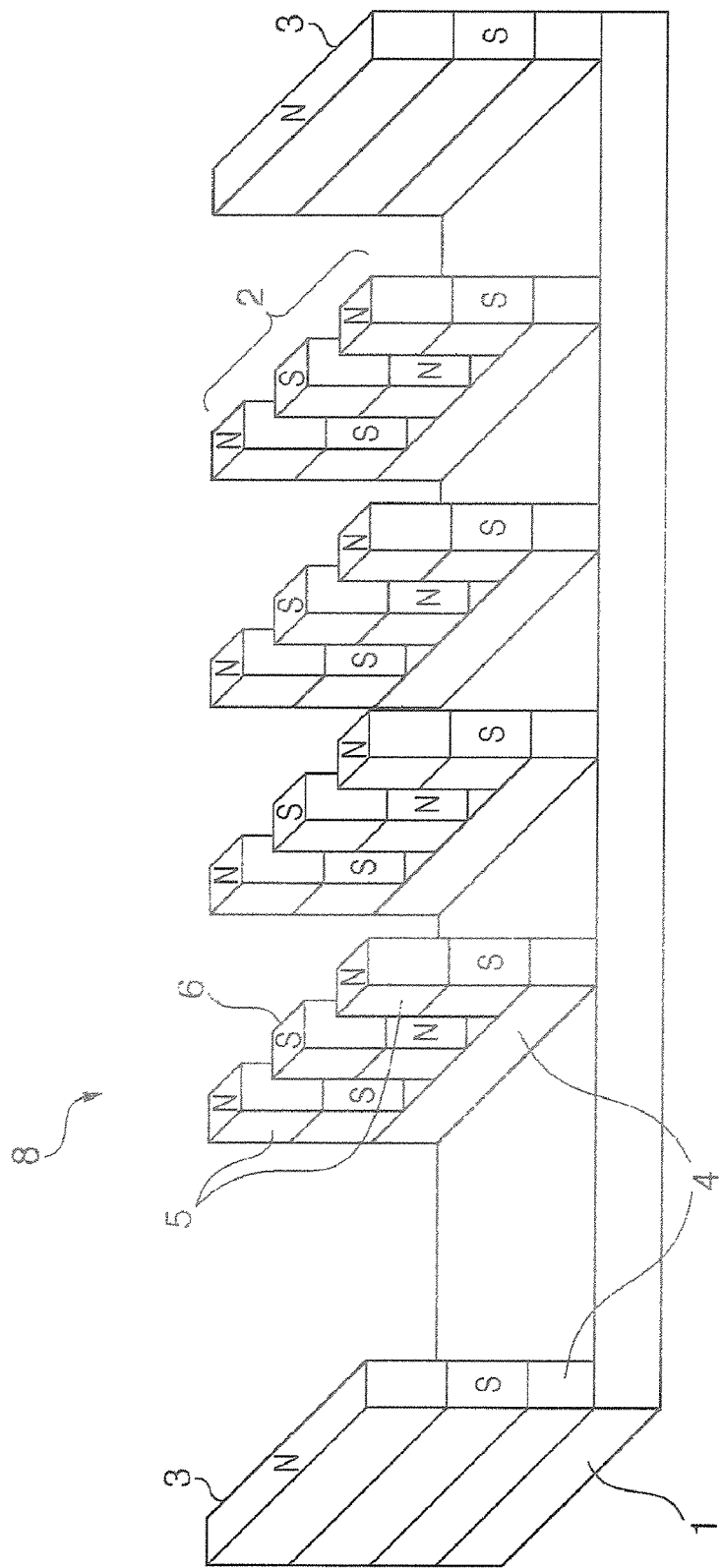

F I G. 7A
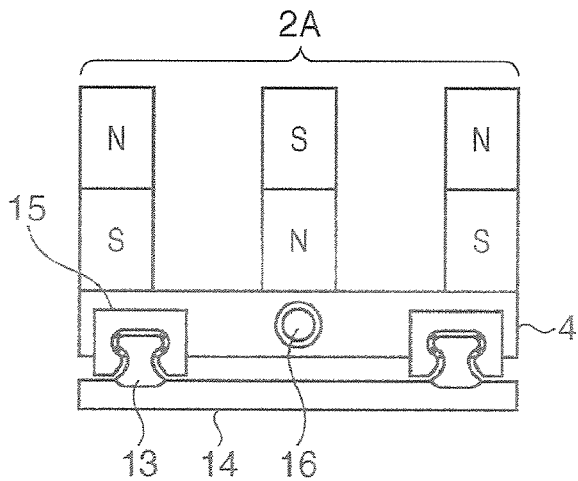
F I G. 7B
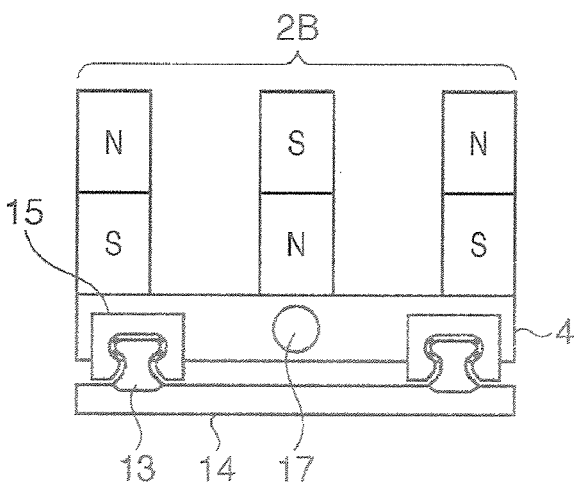
F I G. 7C
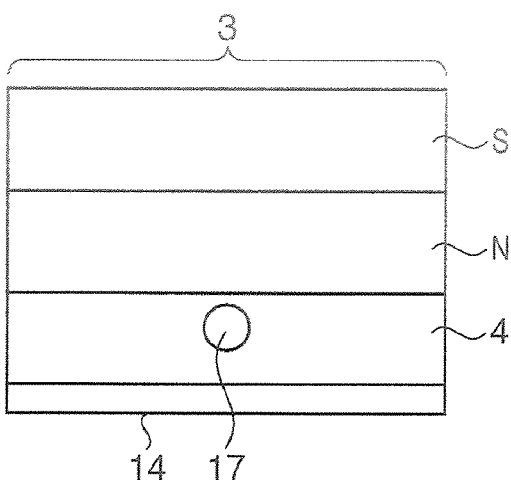

F I G. 12A
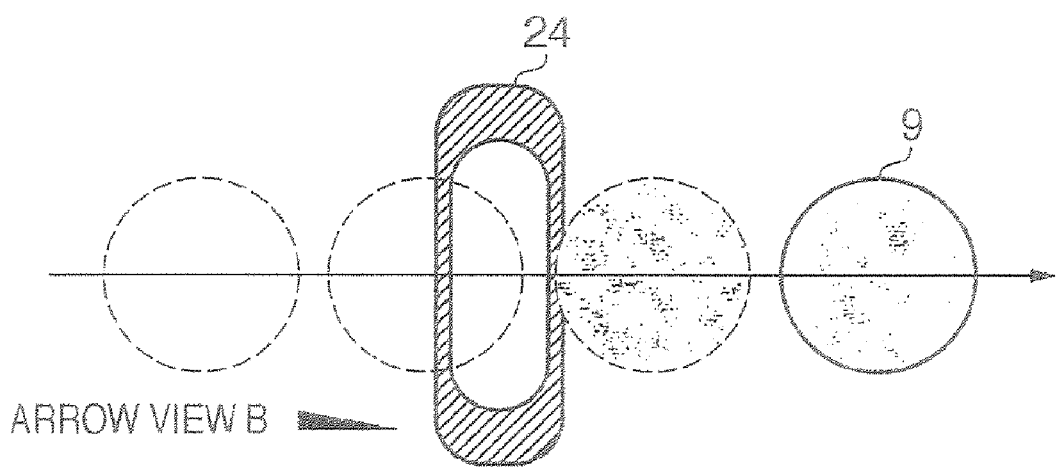
F I G. 12B
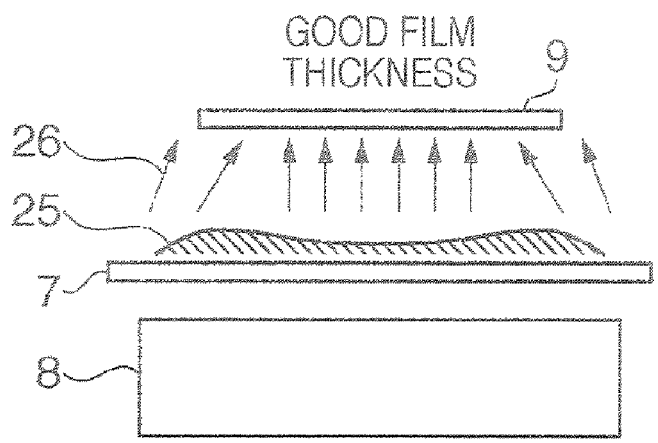

MAGNETRON UNIT, MAGNETRON SPUTTERING APPARATUS, AND METHOD OF MANUFACTURING ELECTRONIC DEVICE

CROSS-REFERENCE TO RELATED APPLICATION

This application is a continuation of International Application No. PCT/JP2008/069799, filed Oct. 30, 2008, which claims the benefit of Japanese Patent Application No. 2007-283438, filed Oct. 31, 2007. The contents of the aforementioned applications are incorporated herein by reference in their entireties.

TECHNICAL FIELD

The present invention relates to a magnetron unit for a magnetron sputtering apparatus which deposits films of a material on a substrate such as a wafer and, more particularly, to a magnetron unit for a magnetron type sputtering apparatus, a magnetron sputtering apparatus, and a method of manufacturing an electronic device, which use a scheme (to be referred to as an "in-line scheme" hereinafter) of depositing a film while the wafer, which is facing the sputtering target, is scanned next to the target.

BACKGROUND ART

A sputtering apparatus generates a plasma, and causes ions generated by the plasma to collide with a target so as to expel a target material and make it adhere to a substrate, thereby forming a film. Of such film formation processing apparatus, an apparatus called a magnetron type apparatus generates a magnetic field parallel to a target surface by a cathode magnet (magnetron unit) placed on the rear surface of the target. Since this magnetic field crosses the electric field between the target and the substrate, electrons emitted from the target are confined near the target to increase the plasma density. For this reason, the film formation rate in a magnetron type sputtering apparatus strongly depends on the strength of the electric field and leakage magnetic field formed on the target.

The strength of a magnetic field from the magnetron unit placed on the rear surface of a target, in particular, has a significant effect on plasma density and influences the film thickness distribution on a substrate. In general, as the strength of the magnetic field increases, the plasma density increases. This raises the sputtering rates and hence increases the film formation rate at a particular location on the substrate.

Under these circumstances, there have been proposed, as methods of modifying the film thickness distribution on a substrate, a method of implementing adjustments by changing the magnetic circuit for forming a magnetic field by increasing/decreasing the strength of a magnetic field (see patent references 1 to 3):

Patent Reference 1: Japanese Patent Publication NO. 7-26202 (FIG. 1)

Patent Reference 2: Japanese Patent Laid-Open No. 9-118980

Patent Reference 3: Japanese Patent Laid-Open No. 3-75369 (FIG. 5)

DISCLOSURE OF INVENTION

Problems that the Invention is to Solve

In a magnetron sputtering apparatus using the in-line scheme, as shown in FIG. 14, a target 7 is formed into a rectangular shape extending in a direction perpendicular to the transport direction of a substrate (film formation substrate 9) such as a wafer. A magnetron unit 28 on the rear surface side of the target 7 has a structure having a rectangular annular clearance. Permanent magnets having different magnetic poles, which correspond to the entire area of the target 7, are provided in the rectangular annular clearance portion.

In the magnetron unit 28 having such an arrangement, the number of sputter particles from the two sides of the rectangular target (target 7) in the longitudinal direction is small (FIG. 15), and hence the film thicknesses on the two ends of the substrate tend to be less than that on the middle portion (FIG. 16). In such a case, as shown in FIG. 17, it is necessary to improve the film thickness distribution by making some large-scale changes, for example, increasing the length of the target 7 in the direction (y direction) perpendicular to the transport direction (x direction) of the substrate 9. Recently, in particular, with increases in the size of a substrate, the target 7 and the magnetron unit 28 need to be elongated in a direction perpendicular to the substrate transport direction. For these reasons, there have been demands for a rectangular magnetron unit which allows easy adjustment of a film thickness distribution on outer peripheral portions of a substrate.

According to the method disclosed in patent reference 1 since magnet pieces having various heights and sizes must be prepared in advance to adjust a film thickness distribution and the strength of a magnetic field on a substrate is determined by the physical size of a magnet, it is impossible to finely adjust the magnetic field on the substrate.

In addition, a plurality of magnets which can be arranged properly are used for the magnetron unit disclosed in patent reference 2. However, in adjusting the film thickness distribution in the sputtering apparatus based on the inline scheme, the number of magnets to be moved for adjustment is larger resulting in complicated modifications.

In the sputtering apparatus disclosed in patent reference 3, a magnet is configured to increase the magnetic field strength at the two sides of a target in the longitudinal direction. However, the magnet has a continuous shape. For this reason, in order to adjust the magnetic field, the entire magnet needs to be redesigned or replaced.

Means of Solving the Problems

In consideration of the above problems, it is an object of the present invention to provide a magnetron unit which can easily and accurately adjust the film thickness distribution of a film formed on the entire surface of the substrate without being increased in size in a magnetron sputtering apparatus based on the in-line scheme.

In order to achieve the above object, according to the present invention, there is provided a magnetron unit comprising a plurality of first magnet elements each including first magnets which have the same polarity and are provided on two end portions of a yoke plate made of a magnetic material and a second magnet which has a polarity different from that of the first magnets and is provided on a middle portion of the yoke plate, a base plate which is placed to allow the respective first magnet elements to be translated in one direction, and second magnet elements which are respectively fixed on two ends of the base plate in one direction and each include a magnet having the same polarity as that of the first magnet of the first magnet element.

Effects of the Invention

According to the present invention, it is possible to accurately and easily perform film thickness adjustment without increasing the length of a target and magnetron unit. Achieving the desired film thickness distribution on the entire substrate is therefore easier.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 1 is a view showing an example of the arrangement of a magnetron unit of the present invention;

FIG. 7A is a view for explaining the arrangement of the magnet element moving mechanism shown in FIGS. 6A and 6B;

FIG. 7B is a view for explaining an example of the arrangement of the magnet element moving mechanism shown in FIGS. 6A and 6B;

FIG. 7C is a view showing an example of the arrangement of a second magnet element;

FIG. 12A is a schematic view for explaining magnetic field strength and a film thickness state when a film is formed by a sputtering apparatus to which the magnetron unit of the present invention is applied;

FIG. 12B is a schematic view for explaining magnetic field strength and a film thickness state when a film is formed by a sputtering apparatus to which the magnetron unit of the present invention is applied;

BEST MODE FOR CARRYING OUT THE INVENTION

Figure 2A:
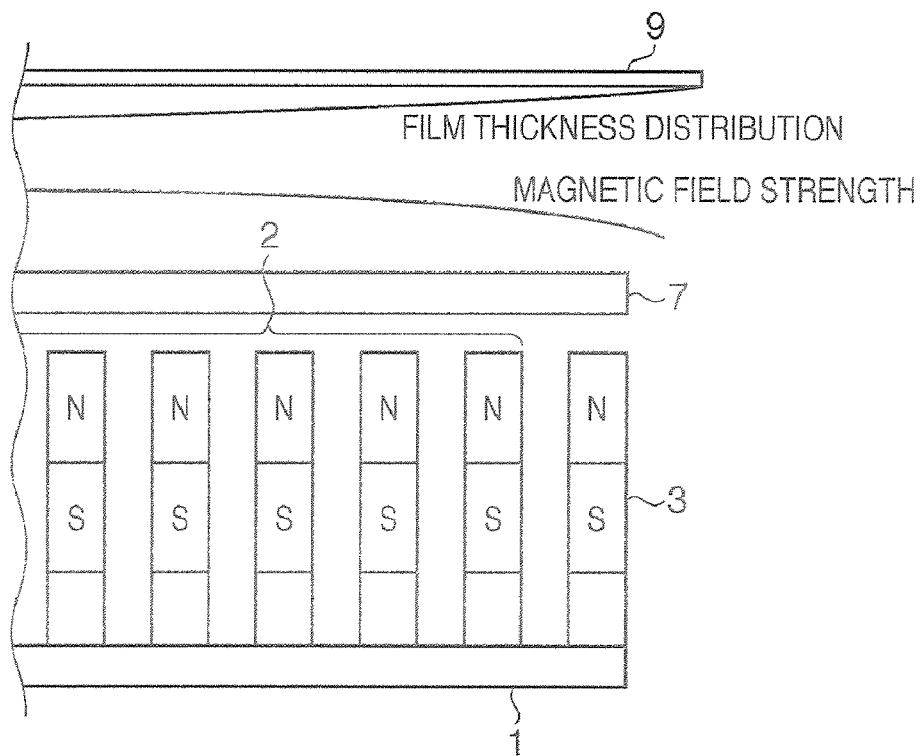
FIG. 2A is a view showing an example of the magnetic field strength on a target which is formed by a magnetron unit without applying the present invention.

The embodiments of the present invention will be described in detail below. Note however that the constituent elements described in the embodiments are merely examples. The technical scope of the present invention is defined by the appended claims, but is not Limited by each embodiment to be described below.

FIG. 1 shows an example of the arrangement of a magnetron unit 8 of the present invention.

The magnetron unit 8 in this case includes a rectangular plate 1 and first and second magnet elements 2 and 3 which are arranged parallel to each other on the rectangular plate 1 in the longitudinal direction.

The first magnet element 2 includes a yoke plate 4 and first and second magnets 5 and 6 having different polarities. The yoke plate 4 is made of a magnetic material, and is configured to extend in a direction perpendicular to the longitudinal direction (transverse direction). The first magnets 5 having the same polarity are provided on the two ends of the yoke plate 4. The second magnet 6 is fixed at the middle portion of the yoke plate 4. The first magnet elements 2 are arranged parallel to each other along the longitudinal direction of the rectangular plate 1, and can be moved by a sliding mechanism including a linear guide 15 and rails 13 as shown in, for example, FIG. 5A. The transport mechanism can position the first magnet element 2 at an arbitrary position in the longitudinal direction.

The second magnet elements 3 are fixed on the two ends of the rectangular plate 1 in the transverse direction through the yoke plates 4. The second magnet element 3 has a magnet 3a with the same polarity (the S pole in the case shown in FIG. 1) as that of the second magnet 6 on the yoke plate 4. The second magnet element 3 has a magnet 3b with the same polarity (the N pole in the case shown in FIG. 1) as that of the first magnet 5. It is disposed on the magnet 3a with the same polarity as that of the second magnet 6 on the yoke plate 4.

The magnetron unit 8 having such an arrangement can be placed on the rear surface of the target of a sputtering apparatus based on the in-line scheme.

In order to adjust the strength of the leakage magnetic field on the target so as to improve the sputtered film thickness distribution on the entire surface of the substrate, it suffices to increase/decrease the strength of the magnetic field on a specific location in the target which corresponds to the place where the thickness of the film on the substrate is to be adjusted. That is, it suffices to increase/decrease the strength of a magnetic field in a corresponding place in the magnetron unit placed on the rear surface of the target.

As methods for such adjustment, there is available a method of changing the intervals between magnets in addition to a method of changing the height and material of each magnet.

Figure 2B:
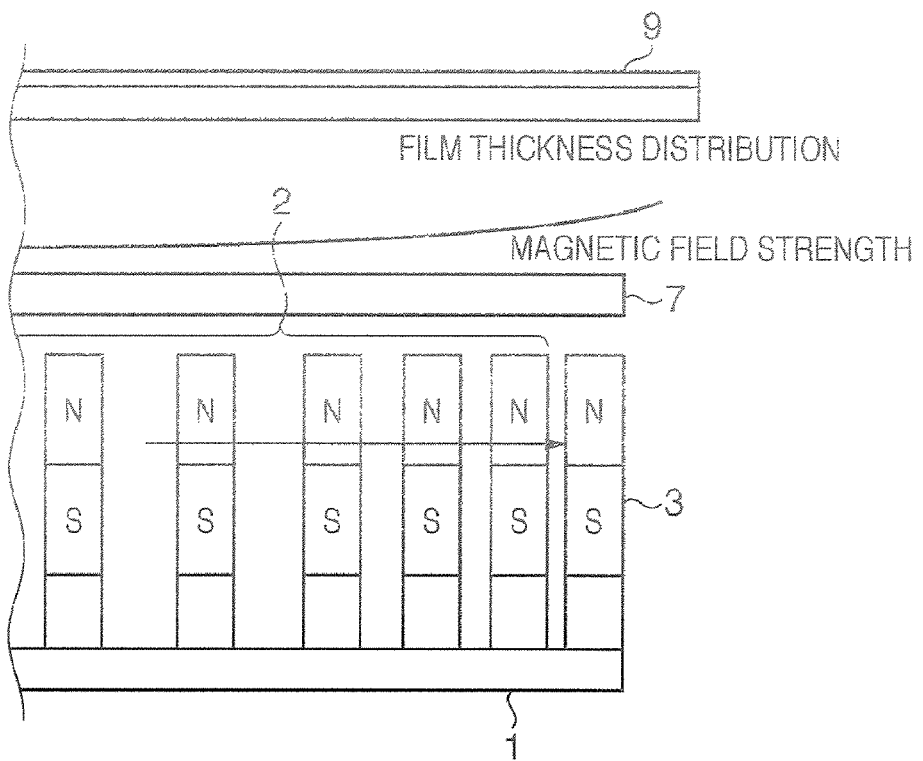
FIG. 2B is a view for explaining the magnetic field strength on a target which is formed by a magnetron unit of the present invention.

As the distance between the first magnet elements 2 which are adjacent to each other as shown in FIGS. 2A and 2B in the magnetron unit 8 of the present invention decreases, the magnetic field strength at an end portion of a target 7 which corresponds to the corresponding place increases (FIG. 2B). As the distance increases, the magnetic field strength at the end portion of the target 7 decreases (FIG. 2A).

According to the magnetron unit 8 having such an arrangement, the magnetic field strength can be changed and the film thickness distribution on the film formation substrate can be adjusted by linear adjustment of the positions of the first magnet elements 2 along the longitudinal direction of the rectangular plate 1.

The following is a form of the sputtering apparatus to which the magnetron unit 8 of the present invention can be applied.

Figure 3:
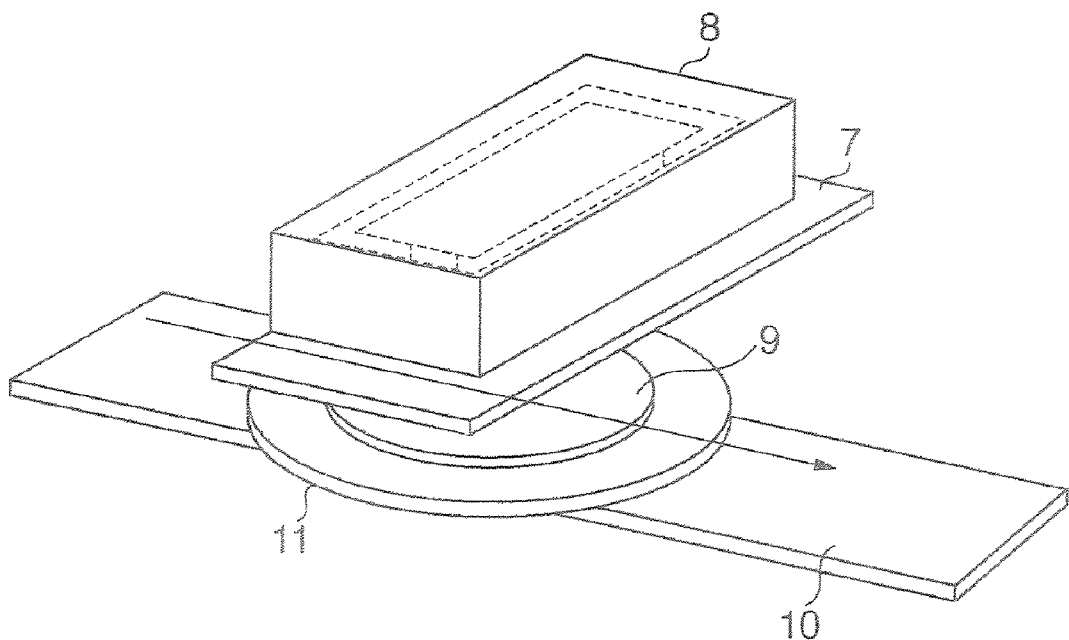
FIG. 3 is a schematic view showing the main part of a sputtering apparatus according to the first embodiment of the present invention.

FIG. 3 is a schematic view showing the main part of the sputtering apparatus according to the first embodiment of the present invention.

The magnetron unit 8 having the arrangement shown in FIG. 1 described above is placed on the rear surface (upper surface side) of the rectangular target 7. A substrate 9 such as a wafer is placed on a substrate stage 11 on the opposite side (lower surface side) to the rear surface of the target 7. This makes it possible to generate a high-density plasma between the target 7 and the substrate 9 by the magnetic field on the surface of the target 7, which is generated from the magnetron unit 8, and the power supplied from a power supply unit (not shown) thereby forming a film by sputtering.

It is possible to transport the substrate 9 by using the substrate stage 11 which is driven in a direction perpendicular to the target 7 length direction by a guide rail 10. Sputtering is made while the wafer is being scanned under the target.

Applying the magnetron unit 8 of the present invention to the sputtering apparatus in this manner can suppress reductions in film thickness on the outer peripheral portions of the substrate. A significant portion of deposited particles come from the two ends of the target 7 in the longitudinal direction.

Figure 4:
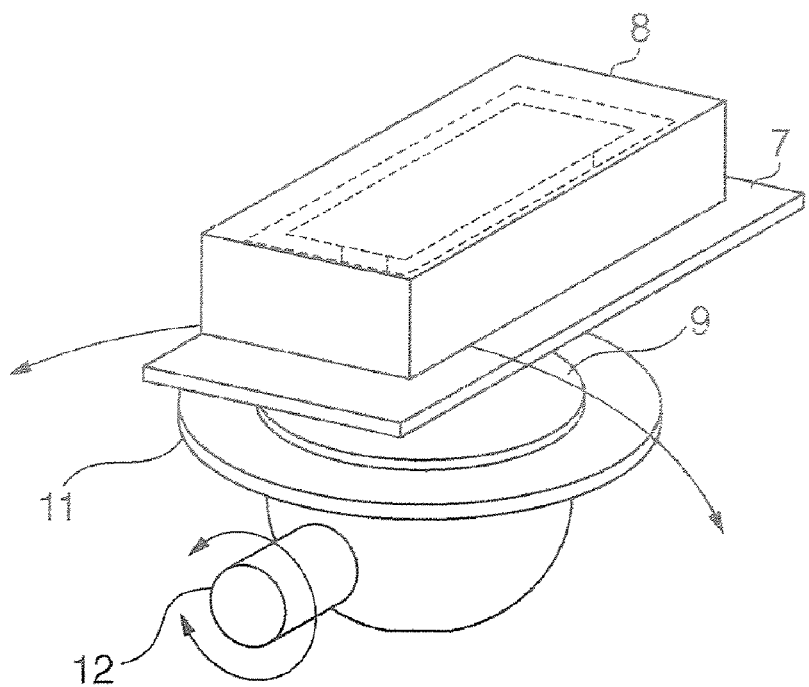
FIG. 4 is a schematic view showing the main part of a sputtering apparatus according to the second embodiment of the present invention.

FIG. 4 is a schematic view showing the main parts of a sputtering apparatus according to the second embodiment of the present invention.

As in the first embodiment, a magnetron unit 8 having the arrangement shown in FIG. 1 described above is placed on the rear surface (upper surface side) of a rectangular target 7, and a substrate 9 is placed on the opposite side (lower surface side) to the rear surface of the target 7. The second embodiment differs from the first embodiment as for the means of scanning the substrate.

In this embodiment, the substrate stage 11 has a shaft 12 parallel to the longitudinal direction of the target 7. The substrate stage 11 rotates about the shaft 12 to make the substrate 9 pass through the front surface of the target 7.

This embodiment can also suppress reductions in film thickness on outer peripheral portions of the film formation substrate which correspond to the two ends of the target 7 in the longitudinal direction.

A concrete example of the arrangement of the magnetron unit 8 will be further described.

Figure 5A:
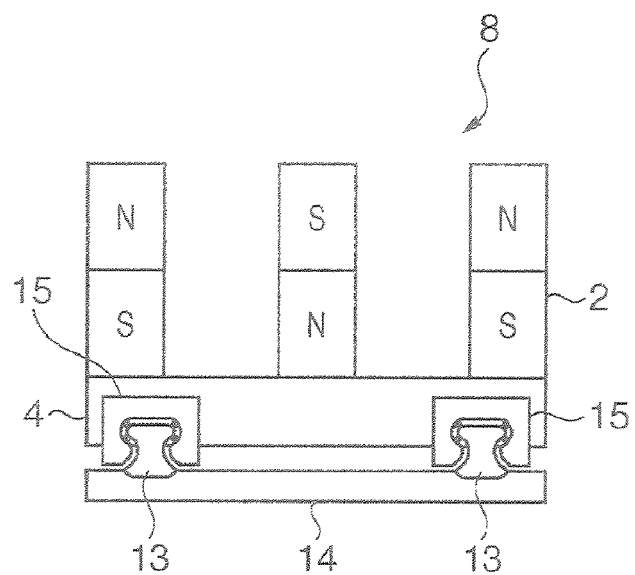
FIG. 5A is an end view showing a concrete arrangement of a magnetron unit of the present invention.
Figure 5B:
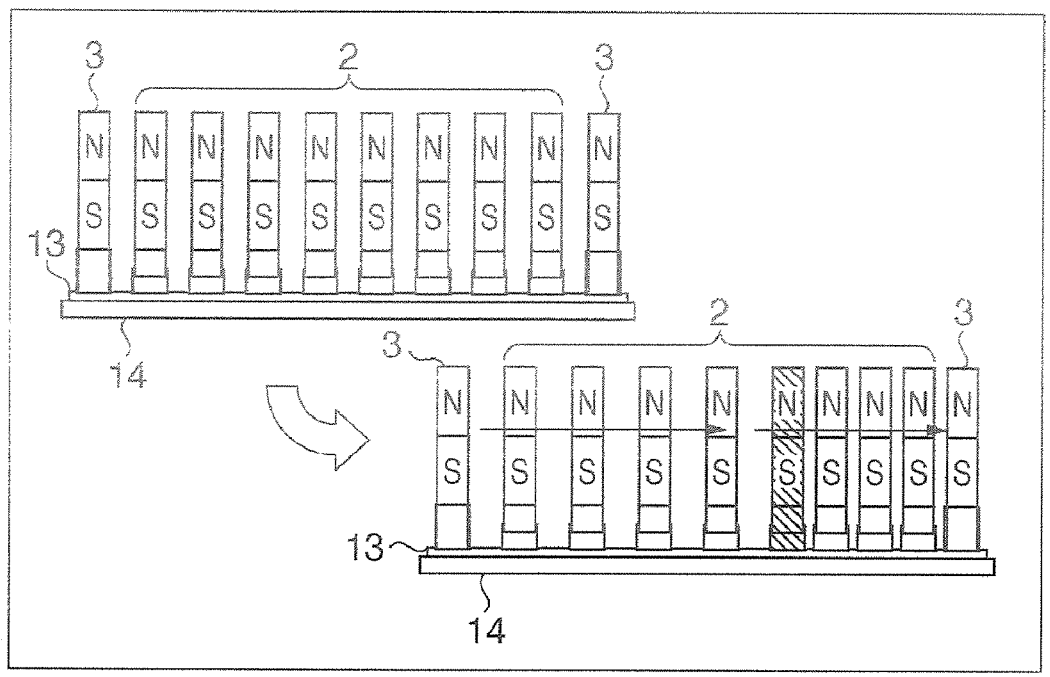
FIG. 5B is a side view showing how the magnet elements of the magnetron unit are moved and adjusted.

FIG. 5A is an end view showing an arrangement of the first magnet elements of the magnetron unit 8. FIG. 5B is a side view showing an example of how first magnet elements 2 of the magnetron unit 8 are adjusted. FIG. 5B aims to show an example of movement/adjustment of the first magnet elements 2. The number of first magnet elements 2 shown in FIG. 5B is not meant to be a limitation for the present invention.

The magnetron unit 8 includes a plurality of first magnet elements 2, rails 13 for the longitudinal movement of the first magnet elements 2, a base plate 14, and second magnet elements 3 fixed to the two ends of the base plate 14. The base plate 14 corresponds to the rectangular plate 1 in FIG. 1. The two rails 13 are fixed on one surface of the base plate 14 and parallel to the longitudinal direction. Two linear guides 15 are fixed to the lower portions of the yoke plates 4 of each first magnet element 2. The central portions of the linear guides 15 and rails 13 have similar widths. Fitting the rails 13 in the linear guides 15 makes it possible or the respective first magnet elements 2 to freely move along the rails 13 on the base plate 14 (FIG. 5A). Note however that the second magnet elements 3 located on the two ends of the magnetron unit 8 in the longitudinal direction are fixed to the base plate 14. When one of the first magnet elements 2 (for example the first magnet element indicated by the hatching in FIG. 5B) is relocated along the rail 13 in one direction. The distances between the magnet elements on either side of the relocated first magnet elements are reduced almost uniformly due to the repulsive forces of the magnetic poles facing each other. Along with this operations the distances between the magnets of the magnet element array, which are located on the opposite side in the moving direction, prolong due to the repulsive force of the magnetic poles facing each other (FIG. 5B).

With the above operation, the magnetic field strength on the surface of the target 7 including the magnetron unit 8 described above can be adjusted at the two ends of the target 7.

Figure 6A:
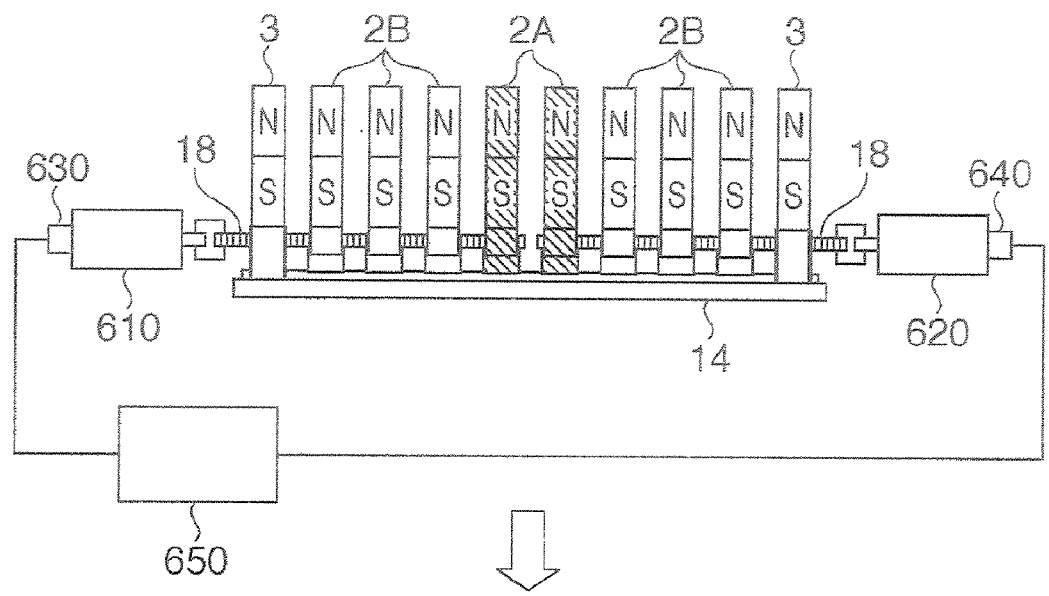
FIG. 6A is a schematic view showing an example of a moving mechanism for magnet elements which is applied to the magnetron unit of the present invention.
Figure 6B:
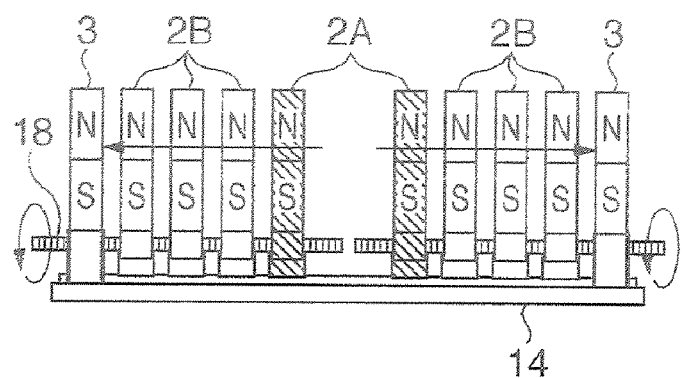
FIG. 6B is a schematic view showing an example of a moving mechanism for magnet elements which is applied to the magnetron unit of the present invention.

A moving mechanism for the first magnet elements 2 of the magnetron unit 8 will be described in detail. FIGS. 6A and 6B are schematic views each showing an example of the moving mechanism for an arbitrary first magnet elements 2. FIGS. 7A and 7B are views for explaining the arrangement of the moving mechanism shown in FIGS. 6A and 6B. FIG. 7C is a view showing an example of the arrangement of the second magnet element 3.

As shown in FIG. 6A, two first magnet elements (magnet elements 2A) are arranged parallel to each other on the middle portion of the base plate 14 as a rectangular plate in the longitudinal direction. In addition, a plurality of first magnet elements (magnet elements 2B) are arranged parallel to each other on the two sides of the array of the two magnet elements 2A in the longitudinal direction of the base plate 14. In the case shown in FIG. 6A, three magnet elements 2B are arranged on the left side of the magnet elements 2A, and three magnet elements 2B are arranged on the right side of the magnet elements 2A. The second magnet elements 3 are respectively arranged on the left and right ends of the base plate 14.

Note that the magnet elements 2A and 2B can be freely moved in the longitudinal direction of the base plate 14 by the moving mechanism (guide means) including the rails 13 and the linear guides 15 described above.

Each magnet element 2A is provided with a screw hole 16 extending through the surfaces of the yoke plate 4 in the moving direction, as shown in FIG. 7A. Each magnet element 2B is provided with a through hole 17 extending through the surfaces of the yoke plate 4 in the moving direction, as shown in FIG. 7B. The hole diameter of the through hole 17 is designed to be larger than the hole diameter (tap diameter) of the screw hole 16. As shown in FIG. 7C, the second magnet element 3 is provided with the through hole 17 in the surfaces of the yoke plate 4 in the moving direction. The hole diameter of the through hole 17 is designed to be larger than the hole diameter (tap diameter) of the screw hole 16.

As shown in FIGS. 6A and 6B, two rod screws 18 are further prepared. Each screw 18 extends through the through holes 17 of the yoke plates 4 of the second magnet element 3 and the plurality of magnet elements 2B, and is attached to the screw hole 16 of the yoke plate 4 of one magnet element 2A.

Referring to FIG. 5A, motors 610 and 620 function as driving mechanisms for rotating/driving the screws 18. Detection means 630 and 640 which are formed by, for example, encoders, detect the rotational speeds and rotational angles of the motors 610 and 620, respectively. A controller 650 determines the travel distance of the magnet elements 2A by controlling the rotational speeds or rotational angles of the motors 610 and 620 based on detection information from the detection means 630 and 640 and the pitch of each screw 18 as a known parameter.

In this arrangement, rotating each screw 18 forcibly moves the magnet element 2A on the rails 13 upon rotation of the screw 18. Simultaneously, a plurality of magnet elements 2B rearrange themselves along the rails 13 independently of the rotation of the screws 18 (FIG. 6B) due to the repulsive force of the adjacent magnet elements.

Figure 8:
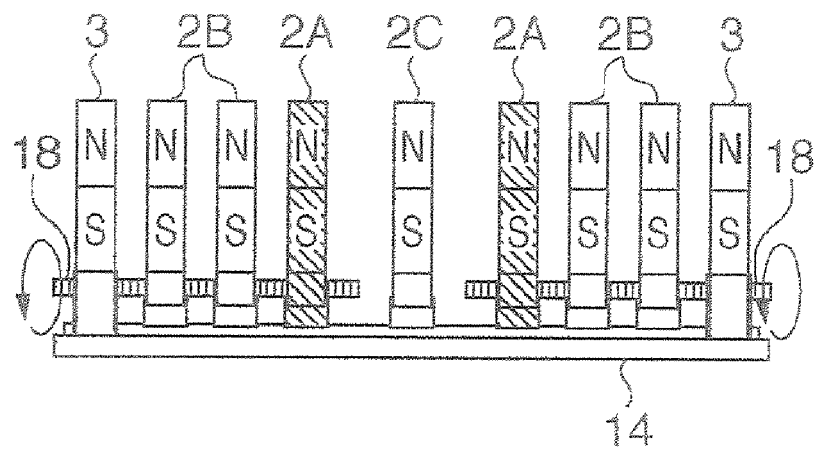
FIG. 8 is a view showing an example of the arrangement of magnet elements in a magnetron unit including a magnet element moving mechanism.
Figure 9:
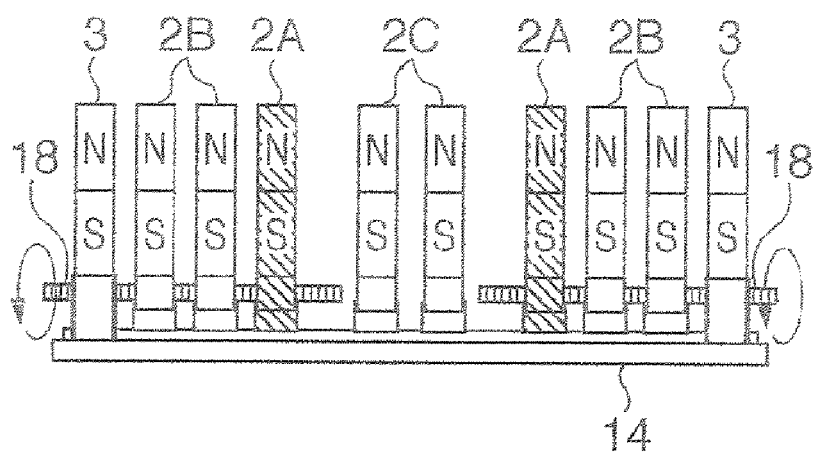
FIG. 9 is a view showing an example of the arrangement of magnet elements in a magnetron unit including a magnet element moving mechanism.

In the magnetron unit including the magnet element moving mechanism using the screws 18 described above, the arrangement of the magnet elements 2A and 2B shown in FIGS. 6A and 6B can be changed. FIGS. 8 and 9 show other examples of the magnet elements 2A and 2B. In order to avoid the same description as that made with reference to FIG. 6A, the control system including the motors 610 and 620, the detection means 630 and 640, and the controller 650 will not be illustrated in FIGS. 8 and 9. FIGS. 8 and 9 show an example of the arrangement of the magnet elements 2A and 2B. The number of magnet elements 2B is not necessarily limited by that is shown in FIGS. 8 and 9.

Referring to FIGS. 8 and 9, a magnet element 2C including one or two first magnet elements is placed on the middle portion of the base plate 14. The two magnet elements 2A are arranged parallel to each other on the two sides of the magnet element 2C in the longitudinal direction. A plurality of magnet elements 2B are arranged parallel to each other on the two sides of the array of the magnet elements 2A and 2C in the longitudinal direction of the base plate 14. The second magnet elements 3 are fixed to the two ends of the base plate 14. Note that the magnet elements 2A, 2B, and 2C correspond to the first magnet elements 2, and can be freely moved along the rails 13 described above in the longitudinal direction of the base plate 14. As the magnet elements 2A are forcibly moved by rotating the screws 18, the plurality of magnet elements 2B move due to the repulsive force of the magnets.

In each of the cases shown in FIGS. 8 and 9, the magnetic field strength at the two ends of the target can be adjusted to be higher than that on the middle portion. This adjustment causes more sputter particles from the two end portions of the target in the longitudinal direction to be deposited onto the substrate, thereby suppressing abrupt reductions in film thickness on the outer peripheral portions of the substrate.

The magnet element 2C on the middle portion of the base plate 14 is not forcibly moved by the screws 18 and is left near the middle portion. The purpose of this arrangement is to prevent the plasma discharge from becoming unstable due to an abrupt reduction in magnetic field near the middle portion of the target.

FIG. 8 shows a case in which one magnet element 2C is used. FIG. 9 shows a case in which two magnet elements 2C are used. Obviously, the present invention is not limited to these examples. It is possible to arrange two or more magnet elements 2C to avoid abrupt fluctuations in magnetic field in the middle portion of the base plate 14 and stabilize the discharge. The number of magnet elements 2C left near the middle portion of the base plate is preferably determined to make 1) the magnetic field strength at the middle portion of the magnetron unit become lower than that at the two ends of the magnetron unit in the longitudinal direction and to make 2) the leakage magnetic field to the middle portion of the magnetron unit to be 300 G or more.

A sputtering apparatus to which the magnetron unit 8 having the above arrangement is applied will be described in detail next.

Figure 10:
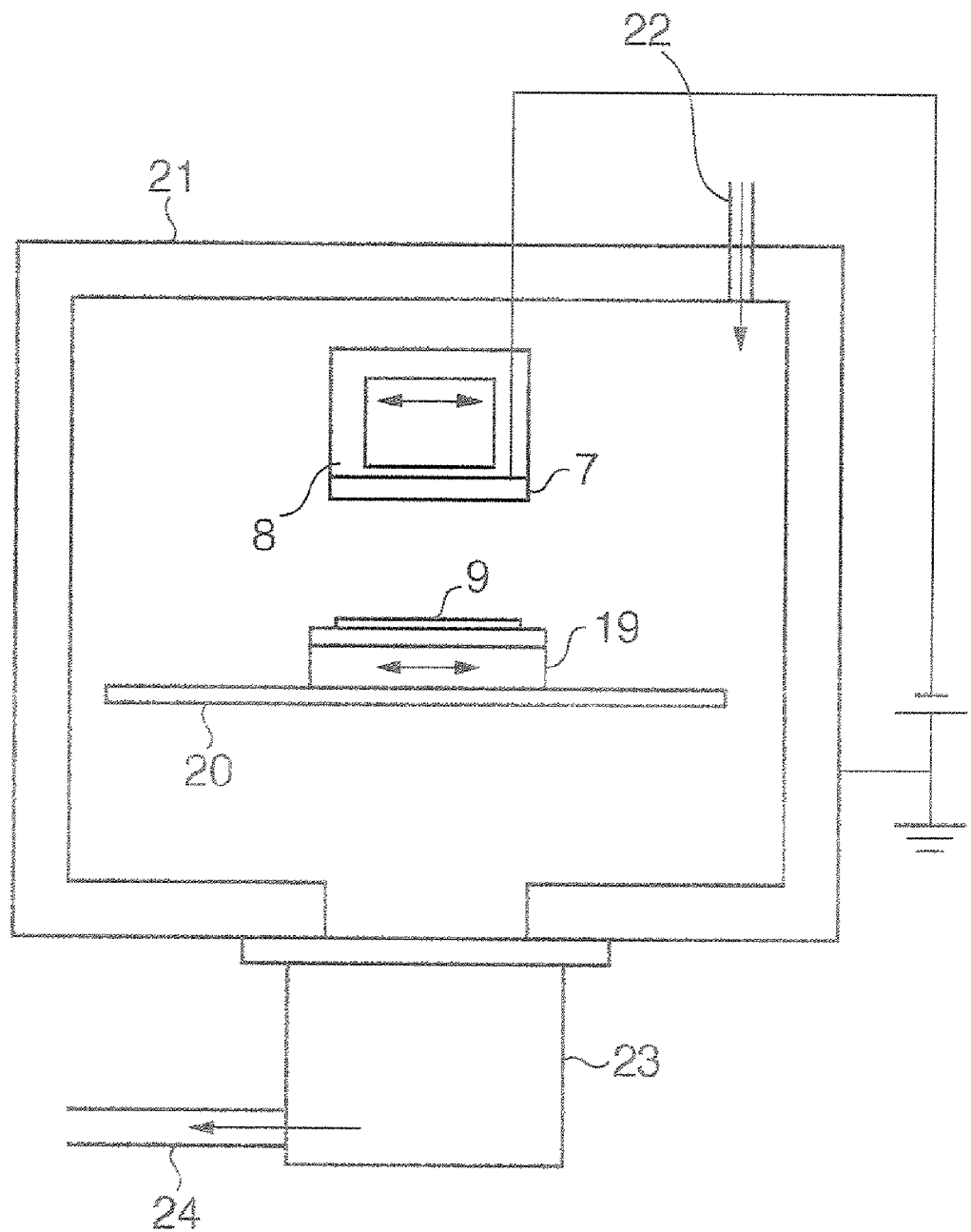
FIG. 10 is a schematic view showing a sputtering apparatus according to the third embodiment of the present invention.

FIG. 10 is a schematic view of a sputtering apparatus according to the third embodiment. As in the first embodiment, the apparatus in FIG. 10 includes a substrate holder 19 which linearly moves in a direction crossing the longitudinal direction of a target 7 (preferably a horizontal direction perpendicular to the longitudinal direction). The substrate holder 19 holds a substrate 9 and can be scanned back and forth along a rail 20 below the substrate holder 19. The substrate holder 19 and the target 7 placed below a magnetron unit 8 are arranged in a vacuum chamber 21 so as to face each other. Magnet elements 2 (not shown in FIG. 10) of the magnetron unit 8 are arranged in a direction perpendicular to the moving direction (the direction indicated by the arrow) of the substrate holder 19.

The vacuum chamber 21 includes a process gas introduction port 22, a vacuum pump 23, and an exhaust port 24.

It is possible to apply a negative voltage to the target 7 to make the magnetron unit 8 placed on the rear surface of the target 7 generate a high-density plasma in a vacuum, thereby causing ion bombardment on the surface of the target 7. This makes it possible to deposit a target material on the substrate 9. In addition, while the substrate holder 19 is scanned on the rail 20, sputtering operation can be performed.

With the aim of improving target utilization, it is also possible to make the magnetron unit 8 be placed on the rear surface side of the target 7 to swing in the moving direction of the substrate holder 19 by using an oscillating mechanism.

Figure 11:
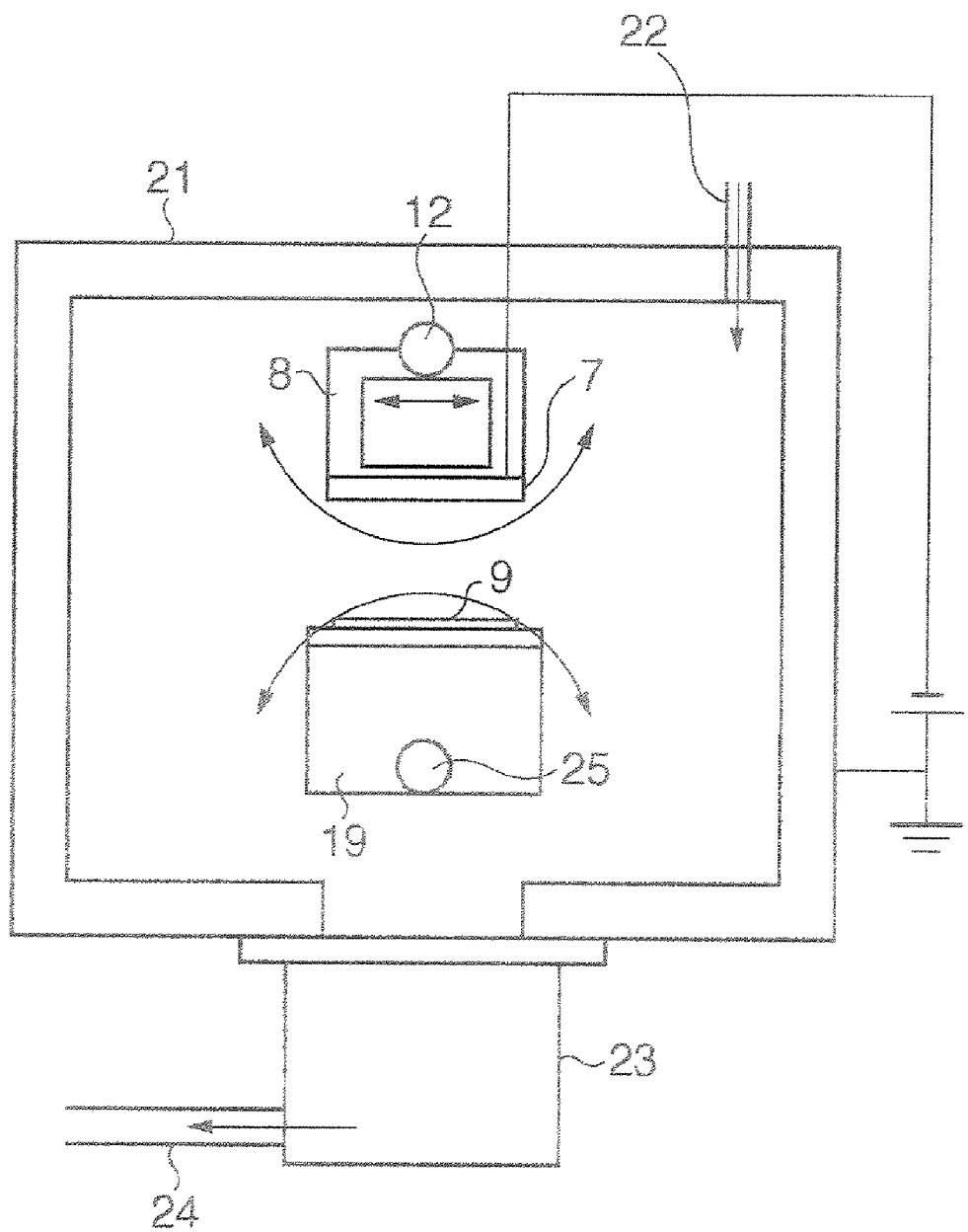
FIG. 11 is a schematic view showing a sputtering apparatus according to the fourth embodiment of the present invention.

FIG. 11 is a schematic view of a sputtering apparatus according to the fourth embodiment. As in the second embodiment, the apparatus in FIG. 11 includes a substrate holder 19 which pans a direction crossing the longitudinal direction of a target 7 (a horizontal direction intersecting at a right angle). The substrate holder 19 and the target 7 placed in a magnetron unit 8 are arranged in a vacuum chamber 21 so as to face each other. In addition, magnet elements 2 (not shown in FIG. 11) of the magnetron unit 8 are arranged in a direction perpendicular to the moving direction of the substrate holder 19.

The magnetron unit 8 and the substrate holder 19 respectively have rotating shafts 12 and 25, and can freely rotate about the rotating shafts 12 and 25. Rotating the magnetron unit 8 and the substrate holder 19 about the rotating shafts 12 and 25 in opposite directions can change the offset distance while always maintaining the positional relationship between the target 7 and the substrate holder 19 in a horizontal state. That is, from the viewpoint of the target 7, this state is equivalent to a state in which the substrate holder 19 passes through a space on the cathode surface side.

It is also possible to apply a negative voltage to the target 7 to cause ion bombardment on the surface of the target 7, thereby depositing a target material on the substrate 9, as in the third embodiment. It is also possible to perform sputtering operation while the substrate holder 19 is rotating.

With the aim of improving target utilization, it is also possible to cause the magnetron unit 8 placed on the rear surface side of the target 7 to oscillate in the moving direction of the substrate holder.

In the magnetron unit 8 shown in FIGS. 6A, 6B, 8, and 9 described above, the magnet element 2A is moved by rotating the screw 18, and each magnet element 2B is moved by the repulsive force of a magnetic field (magnetic force) formed by the magnets having the same polarity.

However, the repulsive force of a magnetic field is small in the following cases: the magnetic field formed by the magnet elements 2A and 2B is weak, the magnetic field between the adjacent magnet elements 2B is weak, the magnet elements 2A and 2B are spaced far apart from each others and the adjacent magnet elements 2B are spaced far apart from each other. In such cases, it is not possible to obtain sufficient repulsive force for positioning the magnet element 2B at a desired position. In this case, it is possible to use an elastic member (auxiliary member) which generates an auxiliary force in addition to the repulsive force formed by the magnetic field.

Figure 18:
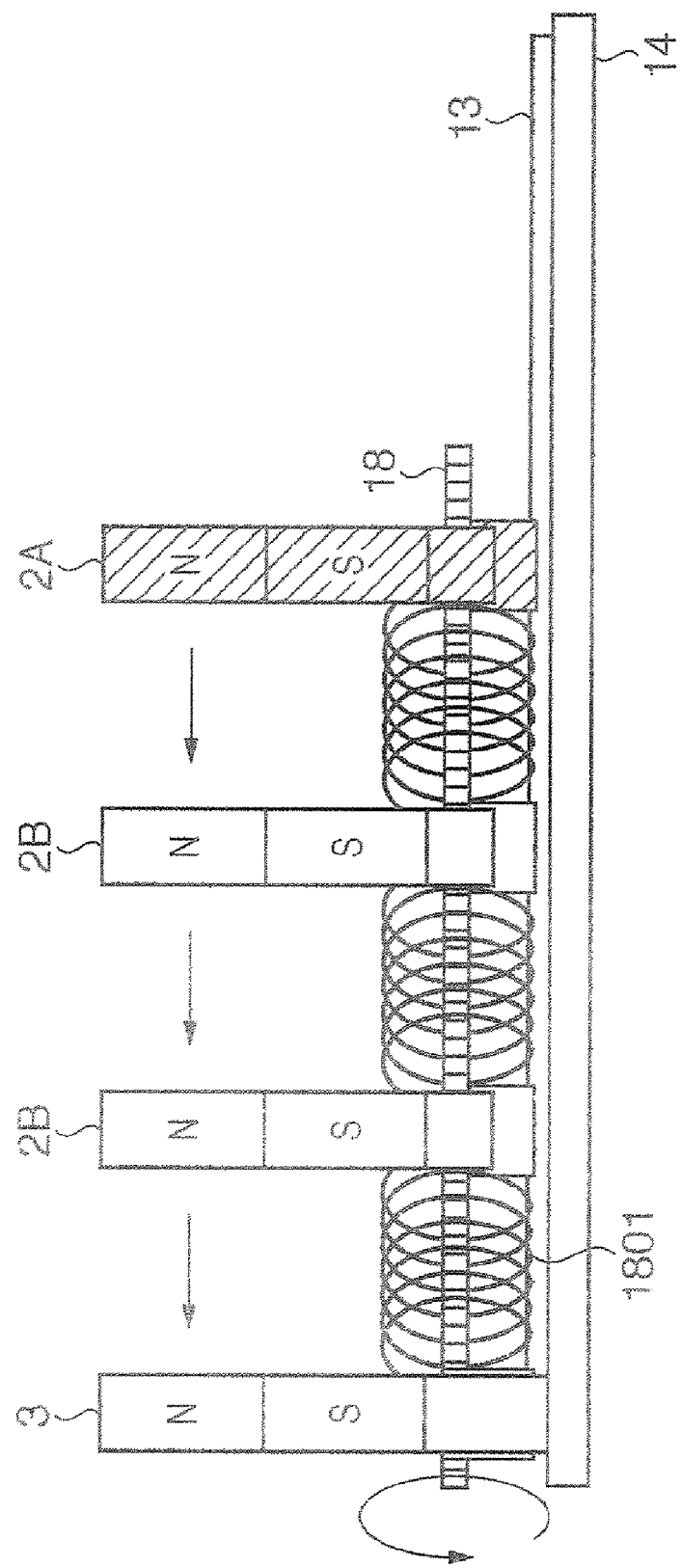
FIG. 18 is a view showing an example of an arrangement using an elastic member as a member which assists repulsive force.

FIG. 18 is a view showing an example of an arrangement using elastic members (auxiliary springs 1801) formed by, for example, coil springs as members for assisting the repulsive force generated between the magnet elements 2A and 2B, between magnet elements 2B, and between the magnet element 2B and the second magnet element 3. As the magnet element 2A moves, the elastic members (auxiliary springs 1801) push away or pull together the magnetic elements assisting the repulsive force of a magnetic field. This force is equal to the relative displacement of each elastic member multiplied (auxiliary spring 1801) by the elastic coefficient (spring constant) of the elastic member. The displacement of each elastic member (auxiliary spring 1801) corresponds to the moving amount of the magnet element 2A. The moving amount of the magnet element 2A is controlled by a controller 650 (FIG. 6A) in accordance with the pitch and rotation amount of the screw 18.

When elastic members (auxiliary springs 1801) each having a predetermined elastic coefficient (spring constant) are arranged, auxiliary repulsive force (the restoring force of each auxiliary spring 1801) is obtained based on the elastic coefficient (spring constant) and the motion distance of the magnet element 2A. The controller 650 can control the motion distance to generate the necessary force based on a known elastic coefficient (spring constant).

The respective elastic members (auxiliary springs 1801) may have the same spring constant. Alternatively, in order to adjust the respective intervals between the magnet elements 2A and 2B, elastic members having different sprang constants may be used.

According to the arrangement in FIG. 18, even if the repulsive force due to the magnetic fields are small, the magnet element 2B can be positioned by elastic member (auxiliary spring 1801).

FIG. 18 shows an example using coil springs as the arrangement of the elastic members (auxiliary springs 1801). However, the spirit the present invention is not limited to this example. For example, it is possible to use elastic members which generate restoring force against elastic deformation, for example, leaf springs.

The relation of magnetic field strength and film thickness by sputtering will be described next. FIG. 12A is a plan view showing magnetic field strength distribution and the film thickness on a substrate by utilizing the invention. FIG. 12B shows the magnetic field strength and film thickness distribution in the direction indicated by an arrow B in FIG. 12A.

Figure 14:
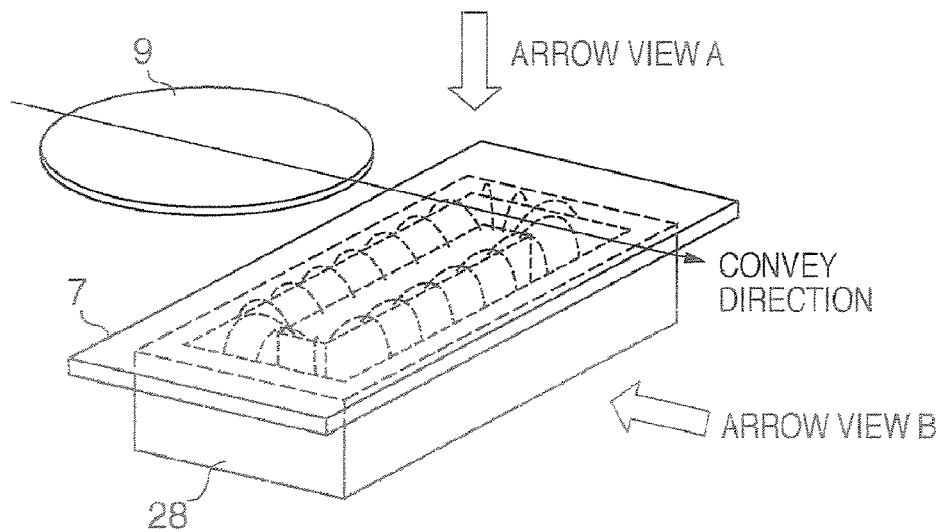
FIG. 14 is a schematic perspective view of a puttering apparatus using a conventional magnetron unit.
Figure 15:
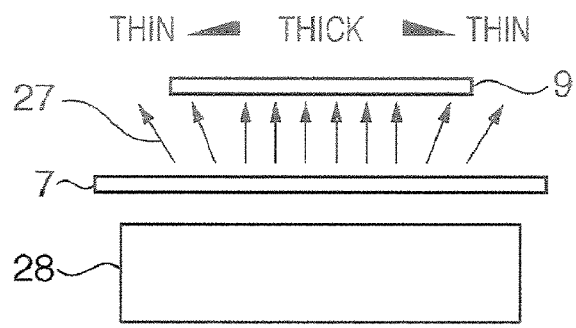
FIG. 15 is a side view showing magnetic field strength and a film thickness state in the direction indicated by an arrow B in FIG. 14.
Figure 16:
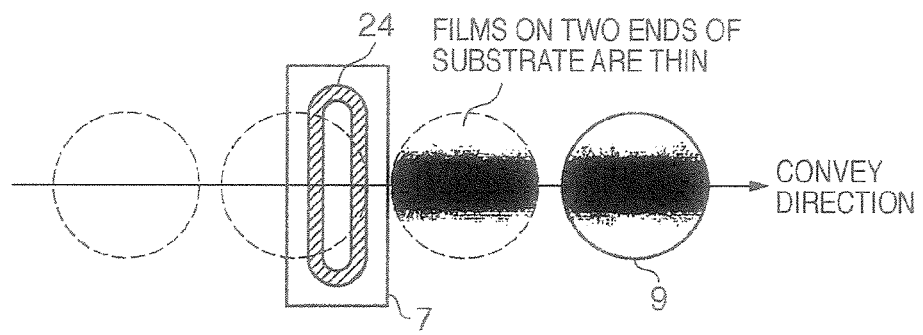
FIG. 16 is a plan view showing magnetic field strength and a film thickness state in the direction indicated by an arrow A in FIG. 14.

According to the conventional magnetron unit (FIG. 14), the amount of sputter particles from the two end faces of the target in the longitudinal direction is small, and hence the film thickness on each end face of the substrate tends to be smaller than that on the middle portion, as shown FIGS. 15 and 16.

Figure 17:
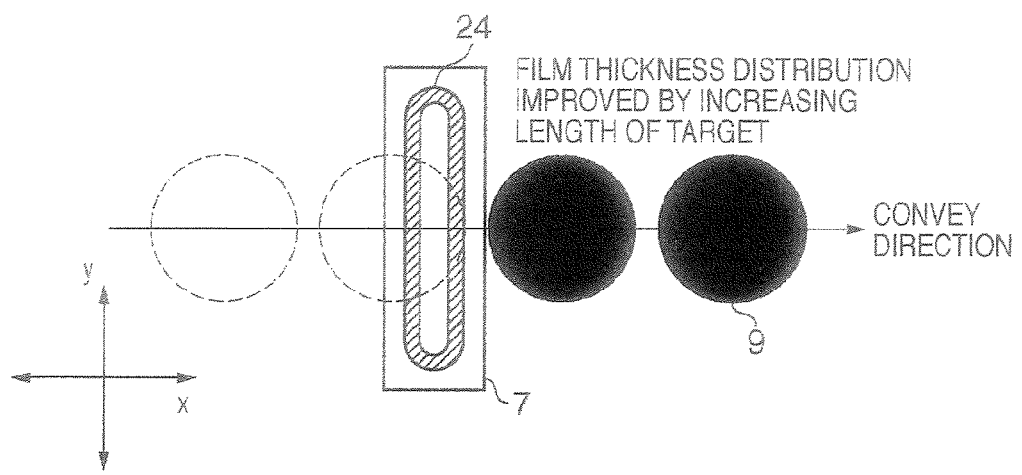
FIG. 17 is a schematic view for explaining a method of improving a film thickness distribution in a conventional magnetron unit.

In contrast to this, when the magnetron unit 8 of the embodiment described above is used, magnetic field strength 25 (visually indicated in FIGS. 12A and 12B) on the two sides (two end portion areas) of the target 7 in the longitudinal direction increases, and the magnetic field strength 25 on the middle portion of the target 7 decreases, as shown in FIGS. 12A and 12B. As a result, the amount of sputter particles 26 from the two sides of the target 7 in the longitudinal direction are increased. This makes it possible to improve the thickness distribution of a film deposited on a substrate surface which passes through the space on the target surface side without increasing the length of the target in the longitudinal direction, as shown in FIG. 17.

Figure 13:
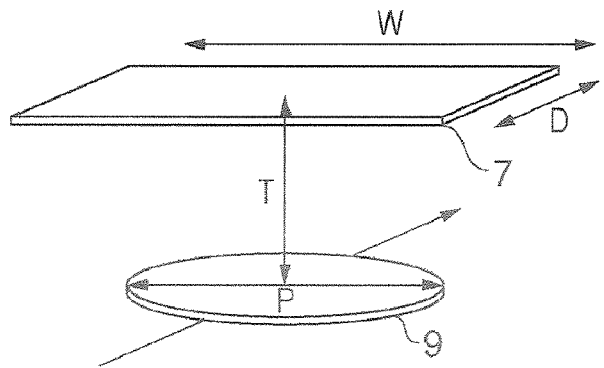
FIG. 13 is a view for comparatively explaining the effects obtained by using the prior art and the present invention.

The effects obtained by using the prior art and the present invention will be compared described by specifying numerical values. FIG. 13 is a view showing the placement relationship between the substrate 9 and the target 7. Referring to FIG. 13, reference symbol W denotes the size of the target 7 in the longitudinal direction; D, the size of the target 7 in the transverse direction; P, the width of the film formation substrate 9 (wafer) in a direction perpendicular to the transport direction; and T, the distance between the target 7 and the substrate 9 facing each other.

When a film with a proper film thickness distribution is to be formed by the prior art the following dimensional relationship is generally set:

$W/P \geqq 2.8$ $W/D \geqq 4.5$ $W/T \geqq 7$

For example, P=200 mm, W=600 mm, D=130 mm, and T=80 mm.

When the present invention was applied, a film thickness distribution defined by Range/Mean<3% could be obtained with the following dimensional relationship:

$2.5 \geqq W/P \geqq 1.8$ $W/D < 4.5$ $6.3 \geqq W/T \geqq 4.5$

That is, the effect of increasing the magnetic flied strength at the two ends of the target in a direction perpendicular to the substrate scan direction can reduce the target length W and therefore, running costs.

For example, an apparatus can be designed with the following dimensions: P=200 mm, W=450 mm, D=130 mm, and T=100 mm.

According to each embodiment described above, there can be provided a magnetron unit which can easily and accurately adjust the film thickness distribution of a film formed on the entire surface of a substrate without increasing the size of the magnetron sputtering apparatus based on the inline scheme.

(Application to Method of Manufacturing Electronic Device)

The magnetron unit 8 according to each embodiment of the present invention can also be applied to a cathode magnet used in forming films for manufacturing an electronic device such as a large flat panel display (liquid crystal display), a thin-film solar panel, a microinductor, a magnetic printhead, a memory device using a magnetic thin film such as an MRAM (Magnetoresistive Random Access Memory), or the like.

For example, in a film formation step (a sputtering step) for a large flat panel display (liquid crystal display) or the like, a large rectangular target (sputtering target) is used. A cathode magnet is placed on the opposite surface side to a sputtering target. In many cases, cathode magnets have rectangular shapes like the magnetron unit 8 in each embodiment of the present invention. Note however that such a magnet has a size in the order of meters. In such a case as well, it is necessary to adjust the film thickness distribution by magnetic field adjustment using the magnetron unit. However, since the magnet itself is large, the repulsive (attracting force) force large. It is therefore difficult to adjust a magnetic field by replacing and attaching/detaching a magnet in the conventional manner.

Figure 19A:
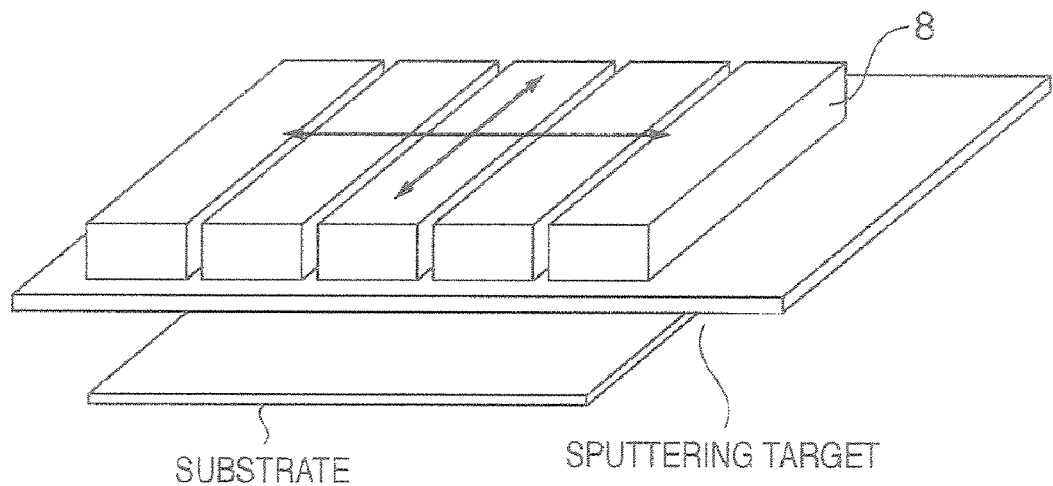
FIG. 19A is a view showing an example in which a magnetic field is adjusted by arranging a plurality of magnetron units for a sputtering target.
Figure 19B:
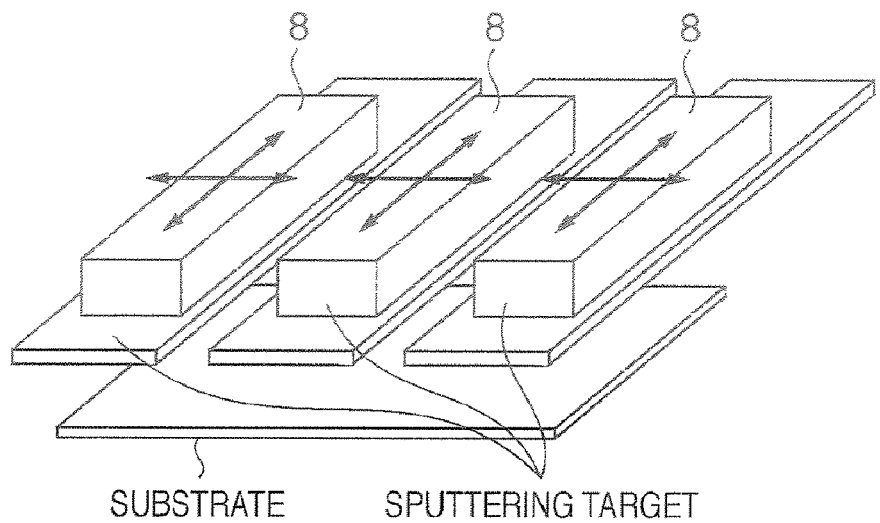
FIG. 19B is a view showing an example in which when there are a plurality of sputtering targets, a magnetic field is adjusted by providing magnetron units for the respective sputtering targets.

FIG. 19A is a view showing an example which adjusts the magnetic field distribution by arranging a plurality of magnetron units 8 for sputtering target. FIG. 19B is a view showing an example in which when there are a plurality of sputtering targets; magnetic field adjustment is performed for each sputtering target by providing the magnetron unit 8 according to the present invention for each sputtering target. The magnetron unit 8 according to each embodiment of the present invention allows magnetic field adjustment without detaching any magnets by being used for a film formation step for the manufacture of an electronic device such as a large flat panel display (liquid crystal display), a thin-film solar panel, a microinductor, or a magnetic printhead, a memory device using a magnetic thin film such as an MRAM, or the like.

Although the preferred embodiments of the present invention have been described with reference to the accompanying drawings, the present invention is not limited to the embodiments and can be variously modified within the technical range defined by the appended claims.

This application claims the benefit of Japanese Patent Application No. 2007-283438, filed Oct. 31, 2007 which is hereby incorporated by reference herein in its entirety.

The invention claimed is:

1. A magnetron unit comprising:
    a plurality of first magnet elements each including first magnets which have the same polarity and are provided on both end portions of a yoke plate made of a magnetic material and a second magnet which has a polarity opposite that of the first magnets and is disposed in the middle portion of the yoke plate;
    a base plate on which moving means is placed to make each of said plurality of first magnet elements move in one axis direction; and
    two second magnet elements, which include yoke plates made of a magnetic material and fixed to both end portions of said base plate and third magnets which have the same polarity as that of the first magnets and are disposed on the yoke plates.

2. The magnetron unit according to claim 1, wherein the moving means disposed on said base plate further comprises
    guide means for allowing said plurality of first magnet elements to move along the one axis direction, and
    a moving mechanism, which moves one of said plurality of first magnet elements in the one axis direction by using the guide means,
    when said one first magnet element is moved by the moving mechanism, other first magnet elements except for said one first magnet element are moved in the one axis direction by repulsive force of magnets having the same polarity, and
    when each of said other first magnet elements is moved, a magnetic field formed by adjacent first magnet elements of said other first magnet elements is adjusted.

3. The magnetron unit according to claim 2, wherein the guide means comprises
    two guide rails provided on said base plate so as to be parallel to the one axis direction, and
    a linear guide which is mounted on the yoke plate of said first magnet element and is configured to move on the guide rails so as to allow each of said first magnet elements to move in the one axis direction.

4. The magnetron unit according to claim 2, wherein the moving mechanism includes a screw,
    the yoke plate of said one first magnet element is provided with a screw hole,
    yoke plates of said other first magnet elements and said second magnet element are provided with through holes larger in hole diameter than the screw hole, and
    as the screw is threadably engaged with the screw hole, extends through the through hole, and rotates, said one first magnet element moves in the one axis direction.

5. The magnetron unit according to claim 4, further comprising control means for controlling movement of the moving mechanism,
    wherein said control means controlling movement of said one first magnet element in the one axis direction based on rotation of the screw and a pitch of the screw.

6. The magnetron unit according to claim 2, wherein elastic members which generate auxiliary repulsive force for assisting the repulsive force in accordance with movement of said one first magnet element are provided between said second magnet element and the first magnet element adjacent to the second magnet element and between said plurality of first magnet elements.

7. A magnetron sputtering apparatus comprising a magnetron unit defined in any one of claims 1 to 6.

8. The magnetron sputtering apparatus according to claim 7, further comprising a substrate holder which holds a film formation substrate provided to face a first magnet element and a second magnet element which constitute said magnetron unit,
    wherein said substrate holder moves in a direction perpendicular to an arranging direction of the first magnet element and the second magnet element which constitute said magnetron unit.

9. A method of manufacturing an electronic device, said method comprising a step of manufacturing an electronic device by using a magnetron unit defined in any one of claims 1 to 6.

10. The method of manufacturing an electronic device according to claim 9, wherein the electronic device includes at least one of a flat panel display, a thin-film solar panel, a microinductor, a magnetic printhead, and an MRAM (Magnetoresistive Random Access Memory).

11. A magnetron unit comprising:
    a plurality of first magnet elements each including first magnets which have the same polarity and are provided on both end portions of a yoke plate made of a magnetic material and a second magnet which has a polarity opposite that of the first magnets and is disposed in the middle portion of the yoke plate;
    a base plate on which moving means is placed to make each of said plurality of first magnet elements move in one axis direction; and
    two second magnet elements which include yoke plates made of a magnetic material and fixed to both end portions of said base plate, third magnets which have the same polarity as that of an upper side of the second magnet and are disposed on the yoke plates, and fourth magnets which have the same polarity as that of an upper side of the first magnets and are disposed on the third magnets.

12. The magnetron unit according to claim 11, wherein the moving means disposed on said base plate further comprises:
guide means for allowing said plurality of first magnet elements to move along the one axis direction, and
a moving mechanism which moves one of said plurality of first magnet elements in the one axis direction by using the guide means,
wherein when said one first magnet element is moved by the moving mechanism, other first magnet elements except for said one first magnet element are moved in the one axis direction by repulsive force of magnets having the same polarity, and
when each of said other first magnet elements is moved, a magnetic field formed by adjacent first magnet elements of said other first magnet elements is adjusted.

13. The magnetron unit according to claim 12, wherein the guide means comprises:
two guide rails provided on said base plate so as to be parallel to the one axis direction, and
a linear guide which is mounted on the yoke plate of said first magnet element and is configured to move on the guide rails so as to allow each of said first magnet elements to move in the one axis direction.

14. The magnetron unit according to claim 12, wherein the moving mechanism includes a screw,
the yoke plate of said one first magnet element is provided with a screw hole,
yoke plates of said other first magnet elements and said second magnet element are provided with through holes larger in hole diameter than the screw hole, and as the screw is engaged with the screw hole, extends through the through hole, and rotates, said one first magnet element moves in the one axis direction.

15. The magnetron unit according to claim 14, further comprising control means for controlling movement of the moving mechanism,
wherein said control means controlling movement of said one first magnet element in the one axis direction based on rotation of the screw and a pitch of the screw.

16. The magnetron unit according to claim 12, wherein elastic members, which generate auxiliary repulsive force for assisting the repulsive force in accordance with movement of said one first magnet element, are provided between said second magnet element and the first magnet element adjacent to the second magnet element and between said plurality of first magnet elements.

17. A magnetron sputtering apparatus comprising a magnetron unit defined in any one of claims 11 to 16.

18. The magnetron sputtering apparatus according to claim 17, further comprising a substrate holder which holds a film formation substrate provided to face a first magnet element and a second magnet element which constitute said magnetron unit,
wherein said substrate holder moves in a direction perpendicular to the one axis direction.

19. A method of manufacturing an electronic device, said method comprising a step of manufacturing an electronic device by using a magnetron unit defined in any one of claims 11 to 16.

20. The method of manufacturing en electronic device according to claim 19, wherein the electronic device includes at least one of a flat panel display, a thin-film solar panel, a microinductor, a magnetic printhead, and an MRAM (Magnetoresistive Random Access Memory).

* * * * *

UNITED STATES PATENT AND TRADEMARK OFFICE
CERTIFICATE OF CORRECTION

PATENT NO. : 7,785,449 B2
APPLICATION NO. : 12/477510
DATED : August 31, 2010
INVENTOR(S) : Tetsuya Endo et al.

It is certified that error appears in the above-identified patent and that said Letters Patent is hereby corrected as shown below:

ON COVER PAGE [56] REFERENCES CITED

Foreign Patent Documents, "JP   59-137965   3/1983" should read --JP 59-137965   9/1984--.

ON COVER PAGE [57] ABSTRACT

Line 10, "portions" should read --portions,--.

COLUMN 1

Line 61, "NO." should read --No.--.

COLUMN 2

Line 30, "reference 1" should read --reference 1,--;
Line 39, "inline" should read --in-line--; and
Line 40, "larger" should read --large,--.

COLUMN 4

Line 3, "puttering" should read --sputtering--; and
Line 32, "Limited" should read --limited--.

COLUMN 5

Line 40, "shown)" should read --shown),--.

COLUMN 6

Line 27, "direction. The" should read --direction, the--.

Signed and Sealed this

Fourteenth Day of December, 2010

David J. Kappos
*Director of the United States Patent and Trademark Office*

COLUMN 7

Line 14, "FIG. 5A," should read --FIG. 6A,--; and
    Line 41, "that is" should read --what is--.

COLUMN 9

Line 19, "others" should read --other,--; and
    Line 29, "springs as" should read --springs, as--.

COLUMN 10

Line 36, "art the" should read --art, the--; and
    Line 61, "inline" should read --in-line--.

COLUMN 11

Line 60, "mechanism," should read --mechanism--.

COLUMN 12

Line 25, "controlling" should read --controls--.

COLUMN 14

Line 7, "controlling" should read --controls--; and
    Line 30, "en" should read --an--.